(12) United States Patent
Gallatin et al.

(10) Patent No.: US 7,131,104 B2
(45) Date of Patent: Oct. 31, 2006

(54) FAST AND ACCURATE OPTICAL PROXIMITY CORRECTION ENGINE FOR INCORPORATING LONG RANGE FLARE EFFECTS

(75) Inventors: Gregg M. Gallatin, Newtown, CT (US); Emanuel Gofman, Haifa (IL); Kafai Lai, Poughkeepsie, NY (US); Mark A. Lavin, Katonah, NY (US); Dov Ramm, Menashe (IL); Alan E. Rosenbluth, Yorktown Heights, NY (US); Shlomo Shlafman, Haifa (IL); Zheng Chen, Poughkeepsie, NY (US); Maharaj Mukherjee, Wappingers Falls, NY (US)

(73) Assignee: International Business Machines Coporation, Armonk, NY (US)

( * ) Notice: Subject to any disclaimer, the term of this patent is extended or adjusted under 35 U.S.C. 154(b) by 233 days.

(21) Appl. No.: 10/844,794

(22) Filed: May 13, 2004

(65) Prior Publication Data

US 2005/0257187 A1 Nov. 17, 2005

(51) Int. Cl.
*G06F 17/50* (2006.01)
(52) U.S. Cl. .......................................... 716/19; 716/21
(58) Field of Classification Search .................. 716/19, 716/21
See application file for complete search history.

(56) References Cited

U.S. PATENT DOCUMENTS

| 6,303,253 | B1 * | 10/2001 | Lu | 430/5 |
| 6,763,514 | B1 * | 7/2004 | Zhang | 716/19 |
| 2004/0205688 | A1 * | 10/2004 | Pierrat | 716/21 |
| 2005/0055658 | A1 * | 3/2005 | Mukherjee et al. | 716/19 |

* cited by examiner

*Primary Examiner*—Sun James Lin
(74) *Attorney, Agent, or Firm*—H. Daniel Schnurmann (57) ABSTRACT

A method is described for performing model-based optical proximity corrections on a mask layout used in an optical lithography process having a plurality of mask shapes. Model-based optical proximity correction is performed by computing the image intensity on selected evaluation points on the mask layout. The image intensity to be computed includes optical flare and stray light effects due to the interactions between the shapes on the mask layout. The computation of the image intensity involves sub-dividing the mask layout into a plurality of regions, each region at an increasing distance from the evaluation point. The contributions of the optical flare and stray light effects due to mask shapes in each of the regions are then determined. Finally, all the contributions thus obtained are combined to obtain the final computation of the image intensity at the selected point.

14 Claims, 8 Drawing Sheets

FAST AND ACCURATE OPTICAL PROXIMITY CORRECTION ENGINE FOR INCORPORATING LONG RANGE FLARE EFFECTS

BACKGROUND OF THE INVENTION

This invention relates generally to the field of optical lithography, and more particularly, to a method for incorporating long-range flare effects in an Optical Proximity Correction (OPC) software tool for use in a model-based optical lithography simulation, to provide a fast and accurate correction of the device shapes in a photo-mask.

The optical micro-lithography process in semiconductor fabrication, also known as the photolithography process, consists of duplicating desired circuit patterns onto semiconductor wafers for an overall desired circuit performance. The desired circuit patterns are typically represented as opaque, complete and semi-transparent regions on a template commonly referred to as a photomask. In optical micro-lithography, patterns on the photo-mask template are projected onto the photo-resist coated wafer by way of optical imaging through an exposure system.

The continuous advancement of VLSI chip manufacturing technology to meet Moore's law of shrinking device dimensions in geometric progression has spurred the development of Resolution Enhancement Techniques (RET) and Optical Proximity Correction (OPC) methodologies in optical microlithography. The latter is the method of choice for chip manufacturers for the foreseeable future due to its high volume yield in manufacturing and past history of success. However, the ever shrinking device dimensions combined with the desire to enhance circuit performance in the deep sub-wavelength domain require complex OPC methodologies to ensure the fidelity of mask patterns on the printed wafer.

Current OPC algorithms pre-correct the mask shapes by segmenting the shape edges and shifting the position of the segments by small amounts. In the current state of the art, Model-Based OPC (MBOPC) software emulates the physical and optical effects that are mostly responsible for the non-fidelity of mask shapes printed on the wafer, as will be described hereinafter with reference to FIG. 1. In the correction phase of MBOPC, the mask shapes are iteratively modified so that the shapes printed on the wafer match the desired shape as closely as possible. This method automatically deforms existing mask shapes to achieve the target dimensions on the wafer.

Figure 1:
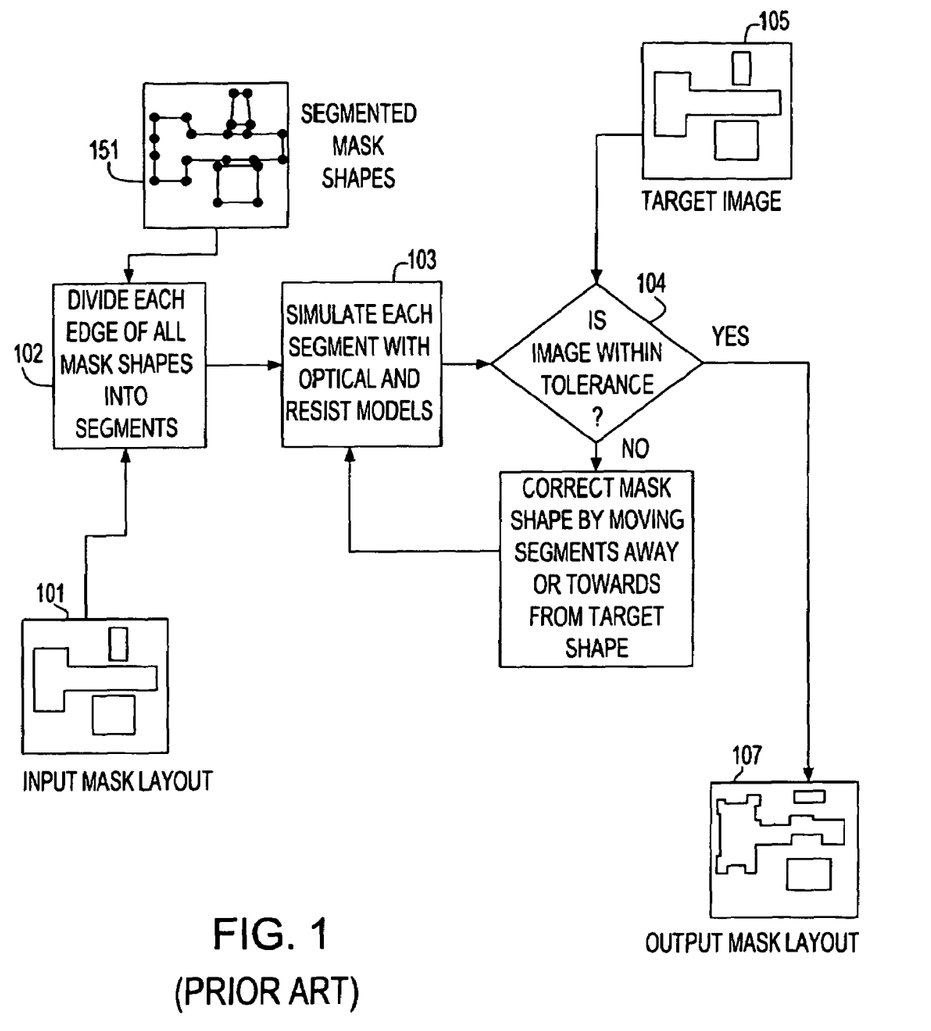
FIG. 1 is a flow chart showing a prior art Model-Based OPC (MBOPC) method that emulates the physical and optical effects that are responsible for the non-fidelity of mask shapes as printed on the wafer.

The aforementioned methodology is illustrated in FIG. 1. In the current state of the art, an input mask layout 101 and a target image 105 are provided. The mask shapes are divided into segments 102, where each segment is provided with a self-contained evaluation point. The optical and the resist image are then evaluated at evaluation points 103. The images at each of the evaluation points are then checked against the tolerance of the target image 104. If the image does not remain within tolerance the segment is iteratively moved forward or backward 106 until all segments reside within an accepted tolerance. Eventually, the final corrected mask layout is outputted 107.

Figure 2:
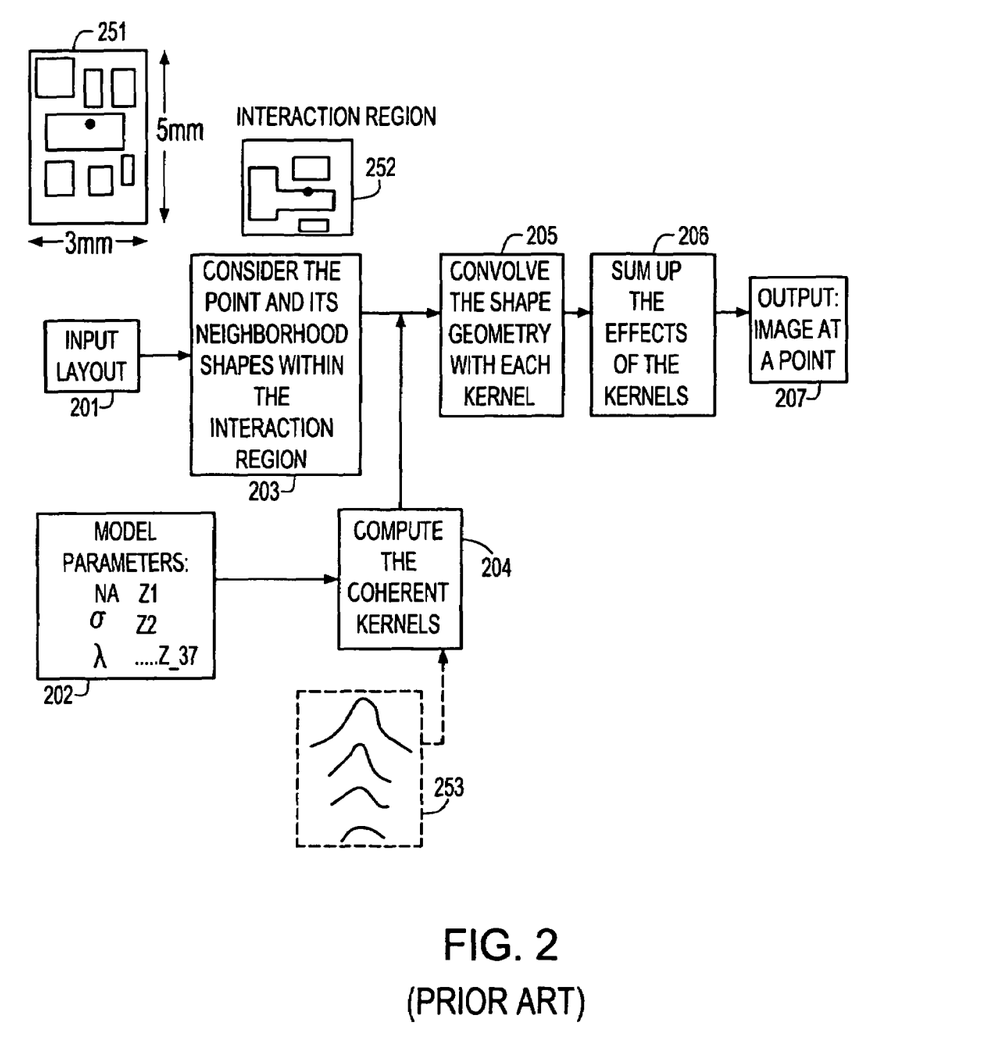
FIG. 2 is a flow chart showing a prior art method for simulating the image intensity at a point due to optical effects.

The core of the method herein described is a computer simulation program that accurately predicts the printed dimension of the shape on the wafer within the appropriate optical and physical parameters, and the original dimension of the shape on the mask, as illustrated in FIG. 2. The success of the model-based OPC depends on using a highly accurate simulator to predict the lithographic processing effects on selected points on the mask shapes which, ultimately, are printed on the wafer. Based on the simulation, an integrated circuit layout modeler determines the overall printed image on the wafer by interpolating selected simulated points.

Aerial image simulators which compute the images generated by optical projection systems have proven to be a valuable tool for analyzing and improving the state of the art of optical lithography systems for the fabrication of integrated circuits. These simulators have found wide application in advanced mask designs, such as phase shifting mask (PSM) design, optical proximity correction (OPC), and design of projection optics. Modeling aerial images is a crucial component of semiconductor manufacturing. Since present lithographic tools employ partially coherent illumination, such modeling is computationally intensive for all but the most elementary patterns. The aerial image generated by the mask, i.e., the light intensity of an optical projection system image plane, is a critically important parameter in micro-lithography for governing how well a developed photo-resist structure replicates a mask design and which, generally, needs to be computed to an accuracy of better than 1%.

In prior art MBOPC tools, the physical effects simulated include only the diffraction of light in the presence of low order aberrations which limit the accuracy of the predictions. One significant effect not currently included is the scattered light which affects the exposure over long distances on the wafer. Such long-range optical effects are generally referred to as "flare" in the literature. Given the current extremely tight requirements on Across-Chip-Line-Width-Variation (ACLV), flare effects need to be included. Also, in some cases, novel RET methods such as alternating Phase Shifting Masks (Alt-PSM) can exacerbate the problem by requiring dual exposure. The problem is even more pronounced in bright field masks that are used in printing critical levels which control the ultimate performance of the circuit, such as gate and diffusion levels.

Referring now to FIG. 2, there is described how the prior art methodology simulates the image intensity at a given point due to optical effects. The input to this methodology 201 is a mask layout and a pre-defined point 251, and a set of process parameters 202 including the light wavelength λ, source parameters, such as $\sigma_1$ and $\sigma_2$, the numerical aperture NA and Zernike parameters defining the lens aberrations. In the next step 203, an interaction region 252 around the point is considered, as are all the mask shapes or portions thereof within the box. The interaction region is a square box having dimensions of a few microns. The size of the box is determined by the computational speed versus accuracy tradeoff. Step 204 computes the SOCS (Sum of Coherent Systems) kernels, which description is given hereinafter. In step 205, the shapes obtained from step 203 are convolved with the kernels obtained in step 204. The kernel values are summed up in step 206 and stored in a discrete two dimensional array. The particular image intensity value is determined in step 207 from the summed values obtained by interpolating the values in the array.

Accuracy is of critical importance to the computation of calibrated optical or resist models. The accuracy in the simulation of wafer shapes is necessary to gain a better understanding and provide an improved evaluation of the OPC methodologies. Through analytical processes, fidelity in the wafer shapes to the "as intended" shapes ultimately achieve a better correction of the mask shapes. An increase in yield at chip manufacturing is a direct consequence for achieving this accuracy.

A significant difficulty when taking into consideration long range effects, such as flare, is the extent of the corrections flare effects required on the mask. In the prior art, optical lens aberrations are modeled by just the 37 lowest order Zernikes and, therefore, only aberrations that deviate light by 1 micron or less are included. The effect of aberrations dies off within that range. The flare effect, on the other hand, extends up to a few mms, thus covering the entire chip area. Current Model-Based OPC (MBOPC) software tools are not equipped to handle such long distance effects.

Figure 3A:
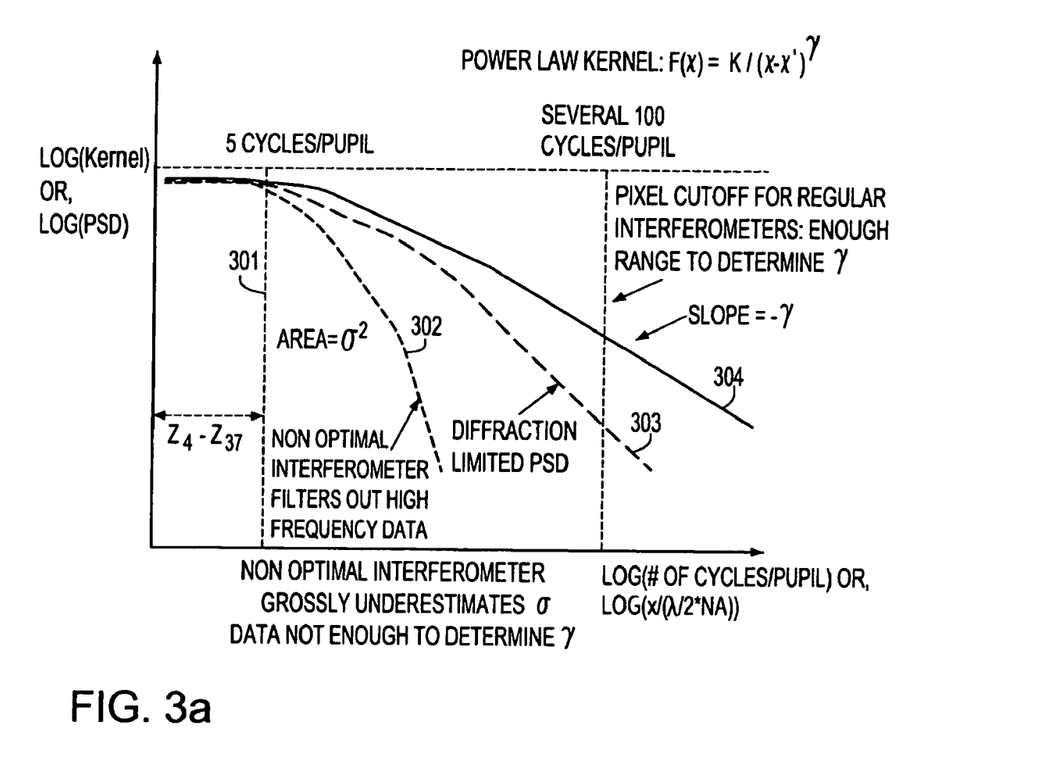
FIG. 3a illustrates the extent of the flare kernel and the power spectral density of flare accounting for the optical energy falling on the exposed mask plotted against the logarithmic distance from the mask opening.
Figure 3B:
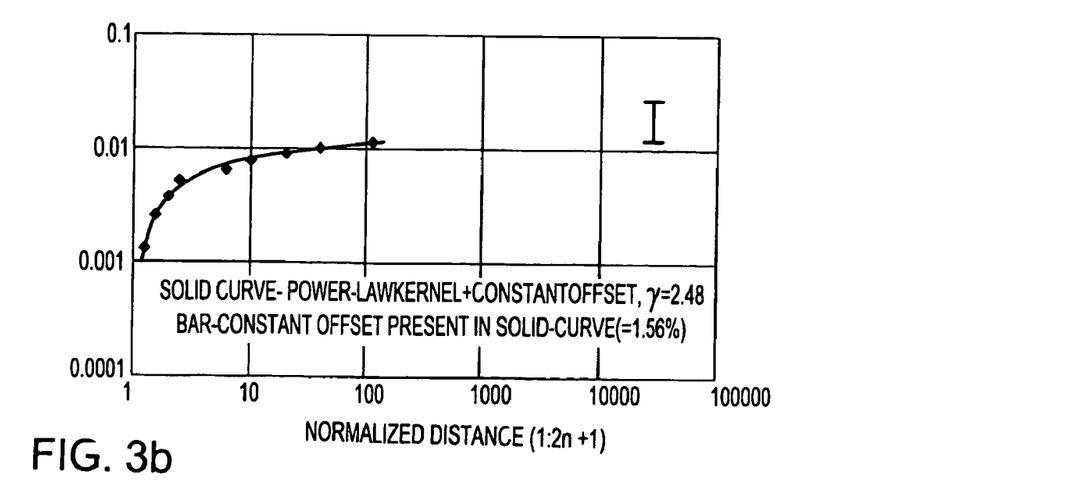
FIG. 3b illustrates how flare varies with respect to distance (in μm). The diamond markers represent the experimental data, while the solid curve shows a fit from a power-law plus an offset. The bar is the fitted constant present in the solid curve (~1.56) caused by stray light.
Figure 3C:
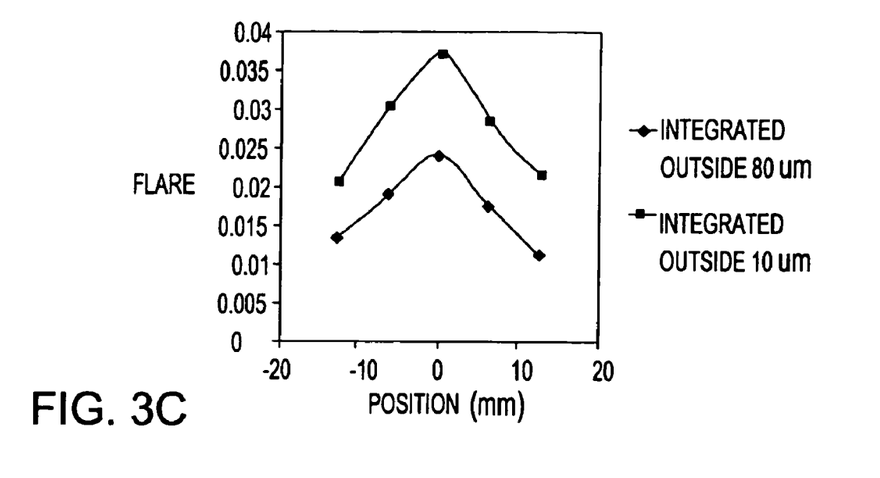
FIG. 3c illustrates variations of flare across field position of flare integrated outside 80 μm and 10 μm distance, respectively. Note that the field variation is twice as large.

The limitations of the current methodology are shown in FIG. 3a. Therein are illustrated the extent of the flare kernel and the power spectral density of the flare accounting for the optical energy falling on the exposed mask. These are plotted against the logarithmic distance from the mask opening. The distance is measured in terms of the number of wave cycles/pupil or the distance $x/(\lambda/2 NA)$, wherein $\lambda$ is the wavelength of the light and NA, the numerical aperture. The limitations of the current art which are modeled by the 37 Zernike polynomial parameters $Z_1$ through $Z_{37}$ are shown in 301. On the other hand, the actual extent of the flare is shown in 304. The flare can be modeled by the Power Law $F(x)=K/(x-x')^\gamma$, wherein the constant $\gamma$ ranges from 1 to 3, and depends on the optical system used in the lithographic process. The non-optimal interferometers that are used to measure the extent of flare is shown in 302. The non-optimal interferometer grossly underestimates the energy of the flare. On the other hand, a regular interferometer can be used to find the extent of the flare, as shown in 303. The variation of flare with respect to distance is shown in FIGS. 3b and 3c that illustrate variations of flare across field position.

In current MBOPC tools, interaction regions are of the order of 1 micron. Any increase in size of that region significantly affects the timing and accuracy of the simulation and, consequently, affects the OPC results. As a result, the need for fast and accurate flare modeling is being felt throughout the industry.

It has been shown through experimental data that the effect of flare on the variation of the Critical Dimension (CD) of transistors and other circuit devices can be as high as 6% of the designed dimensions for certain optical lithography process configurations. Therefore, it is imperative that these effects be considered in the simulation tools used by the MBOPC software.

Figure 4:
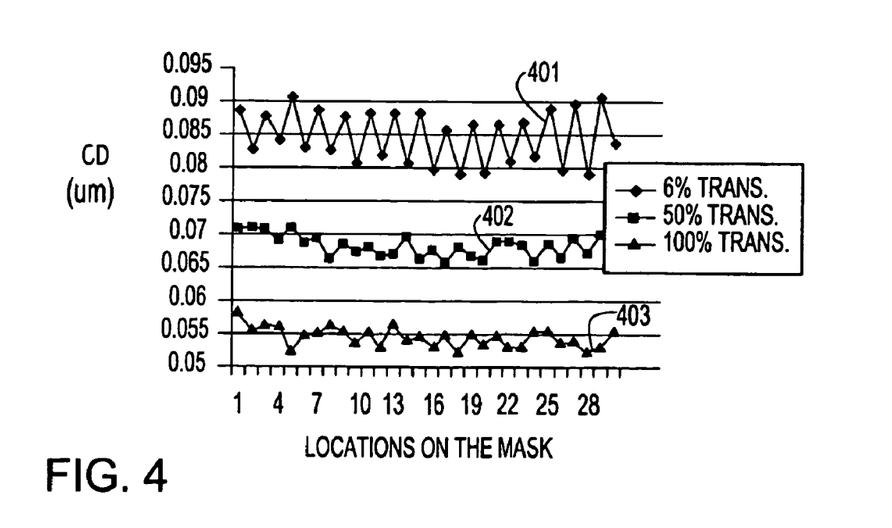
FIG. 4 illustrates variations of the Critical Dimension (CD) on a typical wafer due to flare and which depends on variations of the pattern density.

The experimental justification of flare is shown in FIG. 4. Therein, the same mask structure printed on several locations on the wafer is shown having three different neighborhood background transmissions. Measured CDs of different wafer site locations are plotted against different background transmissions. CDs with 6%, 50% and 100% neighborhood background transmissions are shown in 401, 402 and 403, respectively. It is observed that the CD having a 6% neighborhood background transmission shows more pronounced CD variations than the other plots.

In the prior art, the following mathematical treatment in the optical proximity correction engine is commonly used. These approaches are in one form or another, related to the Sum of Coherent System (SOCS) method, which is an algorithm for efficient calculation of the bilinear transform.

Sum of Coherent Systems (SOCS) Method

The image intensity is given by the partially coherent Hopkin's equation (a bilinear transform):

$$I_0(\vec{r}) = \iiint d\vec{r}\,'dr''h(\vec{r}-\vec{r}\,')h^*(\vec{r}-r'')j(\vec{r}\,'-r'')m(\vec{r}\,')m^*(\vec{r}\,''),$$

where,
h is the lens point spread function (PSF);
j is the coherence;
m is the mask; and
$I_O$ is the aerial image.

By using the SOCS technique, an optimal $n^{th}$ order coherent approximation to the partially coherent Hopkin's equation can be expressed as $$I_0(\vec{r}) \cong \sum_{k=1}^{n} \lambda_k |(m \otimes \phi_k)(x)|^2$$

where $\lambda_k$, $\phi_k(\vec{r})$ represent the eigenvalues and eigenvectors derived from the Mercer expansion of:

$$W(\vec{r}\,',\vec{r}\,'') = h(\vec{r}\,')h*(r'')j(\vec{r}\,'-r'') = \sum_{k=1}^{\infty} \lambda_k \phi_k(\vec{r}\,')\phi_k(\vec{r}\,''),$$

suggesting that a partially coherent imaging problem can be optimally approximated by a finite summation of coherent imaging, such as linear convolution.

SOCS with Pupil Phase Error

The above calculation assumes an ideal imaging system. However, when a lens aberration is present, such as the pupil phase error and apodization, one must include the pupil function:

$$h(\vec{r}) = \iint P(\vec{\sigma}) \exp(i\, W(\vec{\sigma})) \exp(i 2\pi \vec{r} \cdot \vec{\sigma}) d^2 \vec{\sigma}$$

where,
$P(\vec{\sigma})$ is the pupil transmission function; and
$W(\vec{\sigma})$ is the pupil phase function, which contains both aberration and flare information.

Because of the possible higher spatial frequency in the wavefront function, $h(\vec{r})$ will have a larger spatial extent. In this case, the number of eigenvalues and eigenvectors required are higher than those of an ideal system. Hence, the kernel support area is extended to take account of the contribution from a distance greater than $\lambda/NA$. However, the basic mathematical structure and algorithm remains the same.

Physical Model of Flare

Flare is generally considered to be the undesired image component generated by high frequency phase "ripples" in the wavefront corresponding to the optical process. Flare thus arises when light is forward scattered by appreciable angles due to phase irregularities in the lens. (An additional component of flare arises from a two-fold process of backscatter followed by re-scatter in the forward direction, as will be discussed hereinafter). High frequency wavefront irregularities are often neglected for three reasons. First, the wavefront data is sometimes taken with a low-resolution interferometer. Moreover, it may be reconstructed using an algorithm at an even lower resolution. Second, even when the power spectrum of the wavefront is known or inferred, it is not possible to include the effect of high frequency wavefront components on an image integral that is truncated at a short ROI distance, causing most of the scattered light to be neglected. Finally, it is not straightforward to include these terms in the calculated image. The present invention addresses these problems.

Flare also arises from multiple reflections between the surfaces of the lens elements (including stray reflections from the mask and wafer). The extra path length followed by this kind of stray light usually exceeds the coherence length of the source. As a result, ordinary interferometric instruments will not detect it. Thus, as with wavefront ripple, flare from multiple reflections is not considered in the prior art OPC. The reasons are similar, i.e., stray reflections require extra effort to detect, they are largely generated outside ROI, and their contribution to the image is not handled by conventional algorithms of lithographic image simulation.

Stray reflections are dim, and generally represent an acceptable loss of image intensity. Thus, stray reflections are not particularly deleterious unless they actually illuminate the wafer with stray light. For this to occur, it is usually necessary for two surfaces to participate in the stray light path, one surface to back reflect a small portion of the primary imaging beam, and another to redirect some of the stray reflection forward towards the wafer. In nearly all cases, this light is strongly out of focus, and amounts to a pure background. In contrast, stray image light which is reflected back from the wafer and then forwarded from the underside of the mask remains reasonably well imaged at the wafer itself. For this reason, light in the primary image which is back reflected along this particular path (wafer to mask, and back to the wafer) is usually not counted as stray light (particularly if, as is usually the case, the twice-through beam is weak compared to the direct image). In contrast, light following other stray paths will form a defocused background at the wafer. Such an unpatterned background has a non-negligible impact even at a 1% level.

Nowadays, the reflectivity of the mask and wafer are held well below 100% (typically, an order of magnitude lower), but residual mask and wafer reflectivity are themselves typically an order of magnitude larger than the residual reflectivities of the lens element surfaces (which is highly transmissive). Nonetheless, the cumulative impact of all stray reflection paths which involve two successive stray reflections from lens surfaces are roughly comparable to the cumulative impact of those paths involving only a single lens reflection (together with a single reflection from the mask or wafer). This heightened cumulative impact is simply the result of the large number of lens surfaces (e.g., about 50) that are present in state of the art lithography lenses.

In principle, stray reflections do the most damage if focused or almost focused at the primary image plane, but in practice, this instance (unlikely to begin with) is checked for and avoided by lens designers. Stray reflections thus tend to be defocused for large distances, i.e., distances corresponding to the macroscopic scale of characteristic lens dimensions. As a result, the flare kernel from stray reflections is significantly flat on the scale of lens resolution, or even on the scale of typical flare measurement patterns. This behavior allows the contributions to the flare kernel from stray reflections and wavefront ripple to be distinguished from one another, since the latter falls off quite rapidly at distances larger than the lens resolution, e.g., as the inverse second or third power of distance, while the former falls off only slowly.

This is illustrated by the measurements shown in FIG. 3b, which plots an integrated flare within the total flare kernel of the lithographic lens, as measured by integrating boxes of various sizes. The integrated flare increases rapidly at short distance scales, e.g., far more rapidly within the first 10 microns than it does over the next 100 microns. This rapid variation is the result of a rapidly falling power-law flare component from wavefront ripple. In addition, stray reflections make a comparable contribution to total flare in the lens. However, the contribution of the stray reflection is effectively constant over approximately 500 µm scale of the measurement site.

Another characteristic of flare from stray reflections is that the flare kernel varies across the field, as illustrated in FIG. 3c. At both ends of the scatter distance scales that are plotted (integrated scatter outside 10 microns, and integrated scatter outside 80 microns), the amount of light in the flare kernel varies by roughly a factor of two across the field.

Figure 5:
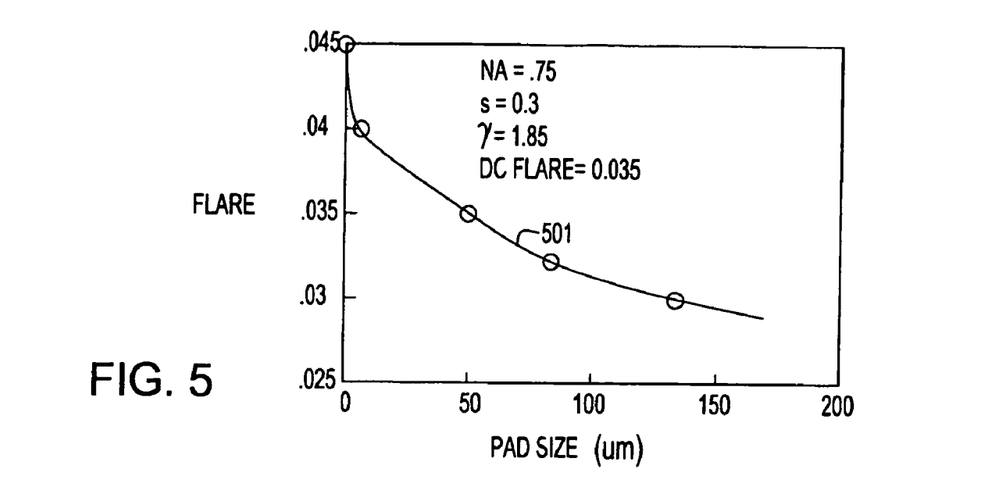
FIG. 5 illustrates variations of flare with respect to distance as an inverse power law function.

It is generally observed that the flare energy from a wavefront ripple follows approximately the inverse power law relationship given by: $F(x)=K/(x-x')^\gamma$. This is shown in FIG. 5. Therein, the extent of flare is plotted for a typical optical process of a numerical aperture (NA) of 0.75 and a pupil size ($\sigma$) of 0.3. Under this condition, the power law shows $\gamma=1.85$.

Currently there are no tools available for Model-Based Optical Proximity Correction (MBOPC) incorporating flare effects and there are no known patents or publications available to that effect. The present invention satisfies the need for a fast MBOPC which accurately incorporates the effect of flare.

OBJECTS OF THE INVENTION

Accordingly, it is an object of the present invention to provide a method for computing the intermediate and long-range image contributions from mask polygons.

It is another object of the present invention to incorporate flare and stray-light effect simulation techniques to an OPC engine.

It is a further object of the present invention to provide a method to simulate incoherent flare.

It is yet another object of the present invention to reduce the time needed to simulate the flare effect.

It is a more particular object of the present invention to provide a reasonably accurate solution for the flare effect simulation.

It is still another object of the present invention to provide a programmable method to divide the photo-mask at different ranges to facilitate the computation of the flare effects simulation.

It is still a further object of the present invention to provide a method to account for the image component generated by the flare effects in an optical lithographic process.

It is yet another object of the present invention to provide a method to compute the variation of critical dimensions of shapes on a photo-lithography wafer due to flare effects in an optical lithographic process.

It is yet a further object of the present invention to provide a method that corrects the device shapes in a photo-lithography mask in order to account for variations of the critical dimensions of shapes on a photolithography wafer due to flare effects in an optical lithographic process.

SUMMARY OF THE INVENTION

These and other objects, aspects, and advantages of the invention are provided by a method for computing a model-based optical proximity correction on shapes present in a mask layout used for an optical lithographic process. The computation depends on the image intensity at a given point and includes all the contributions of optical flare from all the shapes in the mask layout and stray lights due to the optical lithographic process.

In another aspect of the invention, the contributions of the optical flare from all the shapes in the mask layout are computed by first sub-dividing the mask layout into regions at ever increasing distances from the evaluation point, and by considering the mask shapes within each region for use in the computation of the contributions of optical flare for each region. Finally, all the contributions of optical flare of all the regions are combined to determine the total image intensity at the given point.

The present invention provides a method of computing the image intensity of an evaluation point for a mask shape of a mask layout that includes steps of: a) sub-dividing the mask layout into a plurality of regions, wherein the outermost boundaries of the plurality of regions are at a predetermined distance from the evaluation point; b) considering at least one mask shape on the mask layout in at least one region of the plurality of regions; c) computing the contribution of the mask shape in the region to the image intensity at the evaluation point; d) combining the contributions from all mask shapes in the region to the image intensity at the evaluation point; and e) combining the contributions from all the regions to the image intensity at the evaluation point.

The invention further provides a method of computing the image intensity of an evaluation point for a mask shape of a mask layout that includes steps of: a) providing a target design, the target design having a target image shape divided into segments, each of the segments having an associated segment evaluation point; b) providing an initial mask shape, and dividing the mask shape into mask segments corresponding to each of the segments; c) determining a simulated image corresponding to each of the associated segment evaluation points, wherein the simulated image is formed in accordance with the mask shape for a lithographic process; d) providing a deviation tolerance for a deviation of a simulated image metric from a corresponding target image metric; e) determining for each of the segment evaluation points, a simulated image metric based on the simulated image at the segment evaluation point, and f) refining the mask segment corresponding to the segment evaluation point if the simulated image metric exceeds the deviation tolerance.

The invention also provides a method for simulating the wafer image intensity for a mask layout that includes steps of: a) providing at least one short range interaction region for an evaluation point; b) computing a plurality of mask shapes within the at least one short range interaction region; c) computing a component of short range image intensity from at least one of the mask shapes; d) providing at least one intermediate range interaction region for the evaluation point; e) computing a plurality of mask shapes within the at least one intermediate range interaction region; f) computing a component of intermediate range image intensity from at least one of the pluraty of mask shapes; g) providing at least one long range interaction region for the evaluation point; h) computing a plurality of mask shapes within the at least one long range interaction region; i) computing a component of long range image intensity from at least one of the pluraty of mask shapes; and j) combing a plurality of components of the short range image intensity, a plurality of components of the intermediate range image intensity, and a plurality of components of the long range image intensity.

BRIEF DESCRIPTION OF DRAWINGS

The accompanying drawings, which are incorporated in and which constitute part of the specification, illustrate presently preferred embodiments of the invention which, together with the general description given above and the detailed description of the preferred embodiments given below serve to explain the principles of the invention.

DETAILED DESCRIPTION

Figure 7:
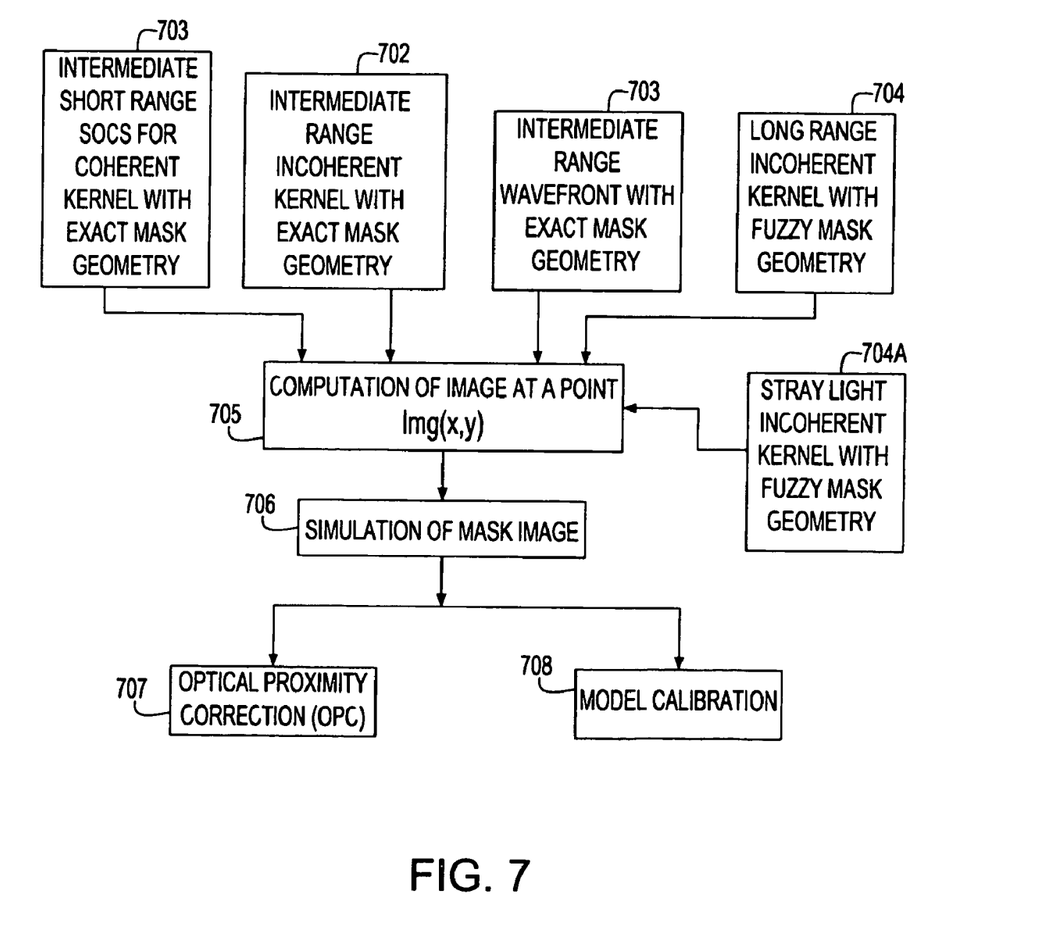
FIG. 7 is a flow block diagram of major components of the present invention.
Figure 8:
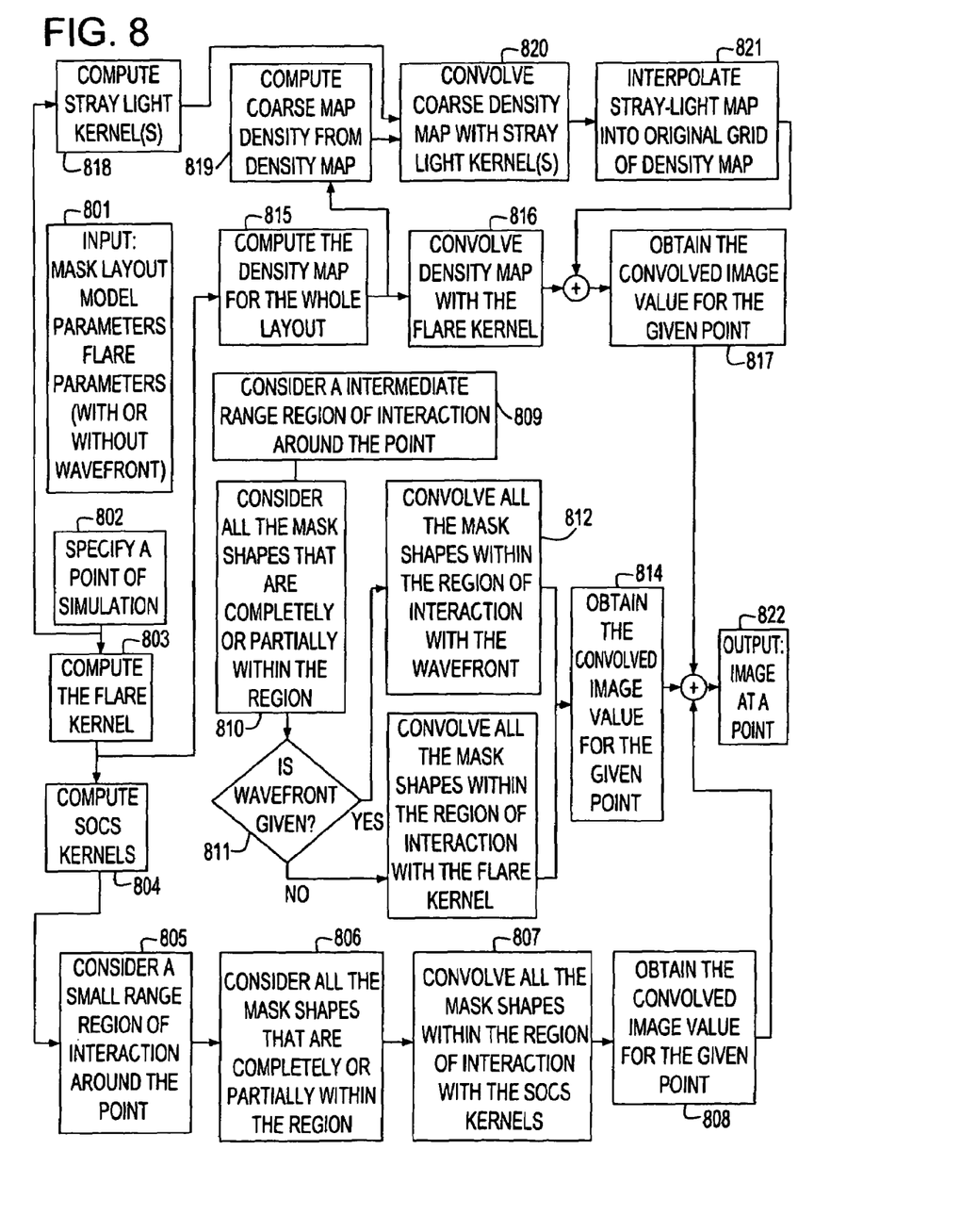
FIG. 8 is a flow chart illustrating the method according with the present invention which computes the image intensity at a selected point and which accounts for the effect of flare emanating from all the shapes on the mask, as opposed to a small region considered in the prior art.

In describing the preferred embodiment of the present invention, reference will be made herein to FIGS. 6–8, in which like numerals refer to like features of the invention.

The present invention is ultimately used in optical lithography to correct for any distortions on a photo-mask having circuit patterns, in order to achieve an accurate projection thereof on the photo-resist coated wafers. In so doing, the invention provides model-based optical lithography simulations that incorporate long-range flare and stray-light effects when simulating a wafer image.

The present invention provide a significant improvement beyond the prior art, as illustrated in FIG. 2, for the computation of the image intensity at a point. In order to compute this image intensity, the invention considers the effect of flare emanating from all the shapes on the mask as opposed to a small region considered in the prior art.

Whereas the prior art shown in FIG. 2 considers only short range interactions of the mask shapes, the present invention achieves the same result by considering the interaction of all the mask shapes within the lithographic mask layout that computes the image intensity at a predetermined point. This is illustrated in FIG. 6a, wherein 651 shows a typical mask layout with all the shapes within the mask. Shown therein is a typical mask shape 652 enlarged for the purpose of gaining a better understanding. Point 620 represents the locus for which the evaluation for 652 is to be performed. In the present invention, interactions of the mask shapes are computed by sub-dividing the entire mask layout in a plurality of regions as a function of their distance from the point of evaluation. By way of example, regions 630, 631, 632, 634 . . . , 635 are respectively positioned at distances D1, D2, D3, D4, . . ., Dn. The shapes within each of these regions are considered separately when determining the contributions to the image intensity, as seen at the evaluation point for each region.

Figure 6A:
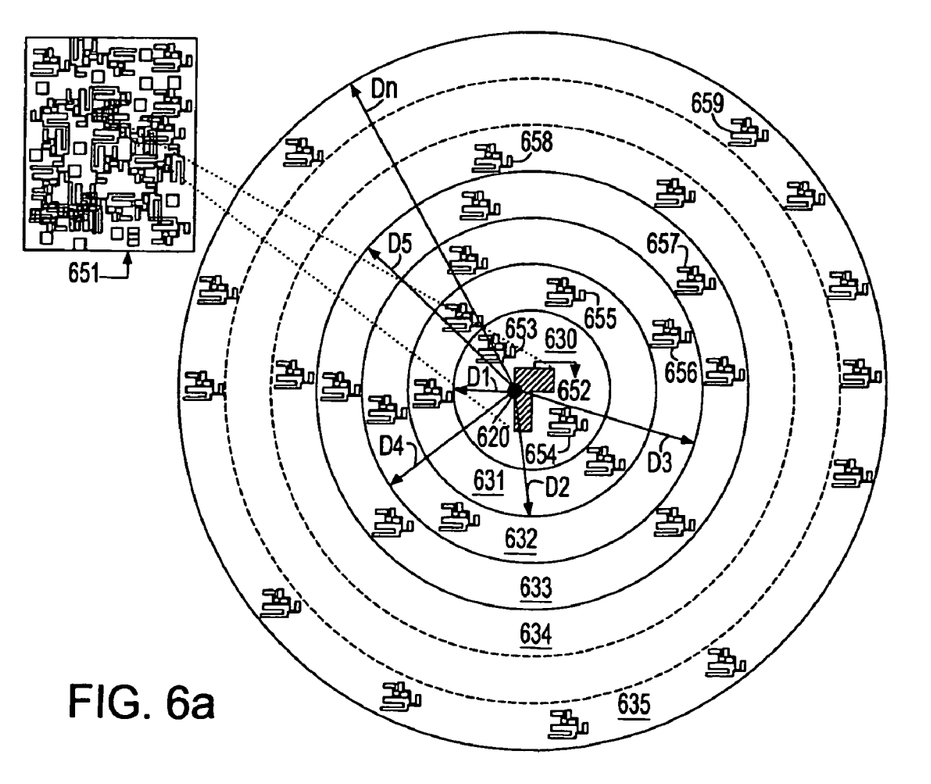
FIG. 6a illustrates the partitioning of the mask shapes into a plurality of sub-regions D1, . . . , Dn, according to the length scales relative to a predetermined evaluation point.

Also shown in FIG. 6a, shapes within the smallest region 630 are referenced by neumerals 652, 653, and 654. These shapes are used to compute the short range component of the image intensity at point 620. Further, the shapes within region 631 (e.g., 655) make their own contribution to the image intensity at point 620, and the shapes within region 632 (e.g., 656) provide their contribution to the image intensity at point 620. Shapes furthest away (e.g., 659) from region 635 are used to compute the long range component of the image intensity at point 620. For simplicity, in the preferred embodiment, the mask layout is shown sub-divided into three regions, as illustrated in FIG. 6b.

Flare from a wavefront ripple can be modeled by the power law kernel $Ax^{-\gamma}$ having two parameters A and $\gamma$, wherein $\gamma$ denotes the amount of smear and the Power Law Coefficient, and A denotes the constant factor due to the intrinsic flare.

The present invention describes a new method for calculating long-range image contributions from the mask polygons. The preferred embodiment thereof is described in FIG. 8.

Two options are provided for computing the long-range effect, each involving computing one or more density maps of the entire mask chip (these are essentially "fuzzy images"). The density map here could refer to either mask shape density map or to the intensity density map when diffraction effects are taken into account. In either case, one of the density maps is convolved with the flare kernel described as $Ax^{-\gamma}$. If the kernel of the stray reflections is small compared to the power law kernel, one option is to use only the first convolved density map as a complete description of long-range flare.

Alternatively, one may resort to an additional density map or maps at a coarser scale to generate a coarse map to be convolved with a spatially varying kernel that accounts for stray reflections. This convolution with a spatially varying kernel is carried out by merging conventional convolutions obtained from multiple regions of the mask. The total computation involves carrying out all the necessary convolutions that are less than those required for the power-law convolution, since the latter must be carried out on a finer scale density map. A density map for the power-law long-range calculation is referred to as a fine-density map. Correspondingly, the stray-reflection long-range calculation is referred to as a coarse-density map.

In contrast with the prior art, in which the short range effect is computed using the SOCS methodology, where the short range effect accounts for diffraction effects of the light source and lower order aberrations, as previously described in the Background of the Invention with reference to FIG. 2, the present invention computes the image intensity at a selected point, sub-dividing the mask layout into a plurality of regions, preferably 3, viz., a short range, an intermediate range and a long range.

The intermediate range initiates where the short range diffraction effects taper off and the flare effects dominate. However, the shapes in this region are sufficiently close to the selected point to be considered as an exact geometry. Therefore, the contribution of shapes in this region in the cumulative image intensity at the given point is determined by convolving the exact geometry of the shapes with the computed flare kernel.

Figure 6B:
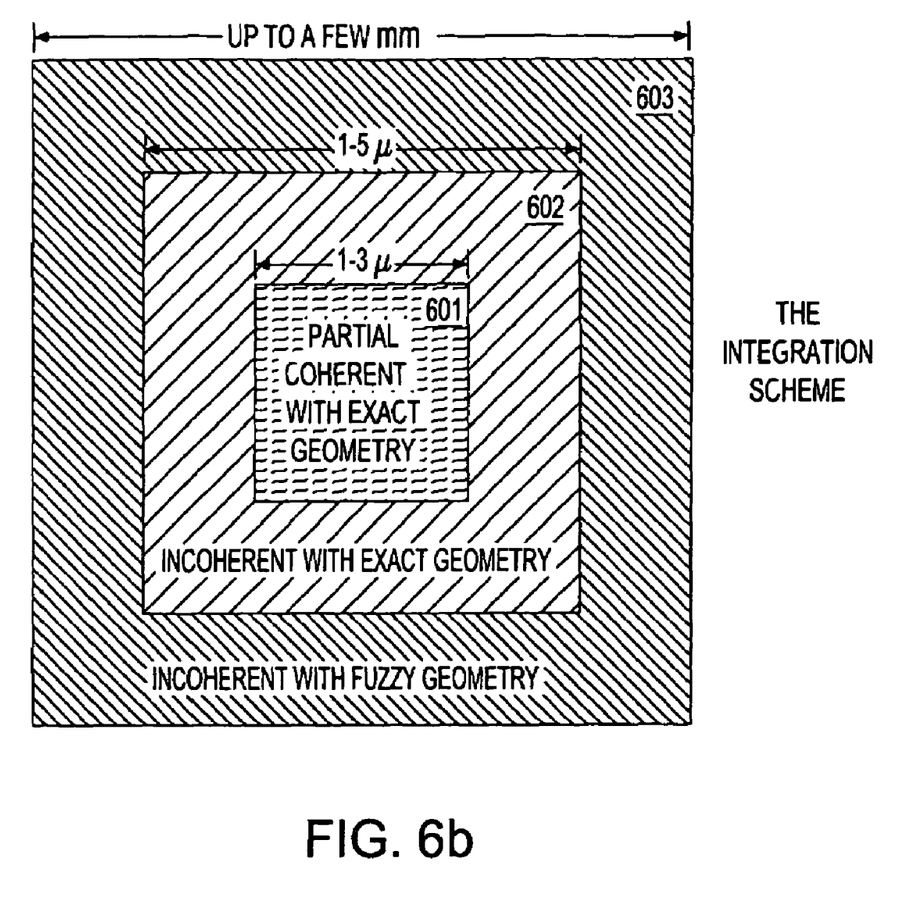
FIG. 6b is a chart showing the wafer sub-divided in three separate regions having different integration schemes, according to the present invention.

The integration methodology is shown in FIG. 6. As previously stated, for illustrative purposes, the mask is sub-divided in three regions, i.e., a short range, an intermediate range and a long range. The short range 601 is a square with dimensions 1–3 microns. In this region, the exact mask geometries are convolved coherently with the SOCS kernel. The intermediate range 602 stretches from 1–5 microns beyond the short range. Within this region the exact mask geometries are convolved incoherently with the flare kernel. The long range 603 stretches up to a few mms (i.e., to the end of the mask boundary) beyond the intermediate range. Within this region the fuzzy mask geometries are convolved incoherently with the flare kernel.

Computing the model calibration or the optical proximity correction depends on the computation of the simulated image at a given point. This is shown in FIG. 7, wherein basic building blocks of the invention are illustrated. Therein, block 701 shows the method where exact mask geometries are convolved coherently with the SOCS kernel for the short range. Block 702 depicts a method wherein the exact mask geometries are convolved incoherently with the flare kernel, if a wavefront of the optical source is not given for the intermediate range. Block 704 illustrates a method wherein exact mask geometries are convolved coherently with the wavefront, if the wavefront of the optical source is provided for the intermediate range. Block 704 illustrates the method wherein fuzzy mask geometries are convolved incoherently with the flare kernel for the long-range. Block 704A illustrates the method in which fuzzy mask geometries are convolved incoherently by way of the stray light kernel for stray light effects. The above convolutions result in blocks 701–704 and 704A combined to compute the simulated image at a given point in block 705. The simulation of the complete wafer image is computed in block 706 using the results obtained from block 705. The optical proximity correction 707 and the model calibration 708 are then performed using the results computed in block 706.

The input to the methodology is shown in block 801. Among the input parameters is a mask layout similar to the layout shown in block 151 of FIG. 1. The mask contains hundreds of thousands of device shapes within an area of a few mm$^2$. The information of the mask geometry is provided in computer readable format. Along with the mask geometry, the system is also provided with information related to the lithographic process. This includes the light wavelength, the numerical aperture and any other information related to the optical system. The remaining information in block 801 includes modeling parameters used by flare. This information consists of the constant $\gamma$ of the flare kernel, intrinsic flare and, possibly, the wavefront information for the optical system and shapes of the stray reflection kernels in different regions of the field.

The next step 802 of the preferred embodiment provides the location of a point whose image intensity is to be computed. The location is given with reference to the mask geometry. In the next step 803, the power law flare kernel is computed as A $x^{-\gamma}$. Since the power law flare kernel is used in a discrete convolution, the power law kernel is sampled at discrete points and stored as a two dimensional array.

In the next step 815, the density map for the whole geometry is computed. This step involves sub-dividing the entire mask layout in boxes, e.g., 4 by 4 µm. The speed accuracy tradeoff is achieved by the size of the boxes. If more accurate computation is needed then the squares need to be smaller. However, this may reduce the computation speed. On the other hand, a larger box provides increased computational speed at the cost of accuracy. In this step, each of the boxes is tested against the mask shapes. The pattern density assigned to the box is the fractional open area of patterns and pattern sections falling within the box, as normalized over the total area of the box. In situations where the intensity density map is preferred over the shape density map, then an intensity map is pre-calculated from all the mask shapes to form the density map.

In step 819, a coarse-density map is obtained by averaging adjacent pixels in the fine-density map computed in step 815. Each pixel in the coarse-density map represents, for instance, an average density of 10 by 10 blocks (i.e., 100 pixels) within the fine-scale density map (from step 815).

In the next step 816, the density map as computed in step 815 is convolved with the power law flare kernel, as computed in step 802. The values of this convolution are stored in a two dimensional array, providing a long-range map of power-law flare. In one embodiment of the invention, these values account for the long-range contribution for the flare effect.

Step 820 is now carried out, wherein the coarse-density map of step 819 is convolved with the spatially varying stray-reflection kernels that are generated in step 818 based on the input from step 801. This convolution is accomplished by preparing multiple copies of the coarse-density map, where the content of each map is blanked out (open area set to 0) except for a particular field area where one of the stray reflection kernels remains operative. One such partially-blanked out coarse-density map is prepared for each stray light kernel. Coarse long-range stray-reflection partial maps are then prepared by convolving each of these partially blanked-out density maps with its associated stray-reflection kernel. Although several such convolutions are required, the calculation is fast because coarse-density maps are used. These long-range stray-reflection maps are then interpolated over the grid of the density map of step 815, as shown in step 821, and are then added to the long-range map of power-law flare (step 816) in the two-dimensional array which tabulates the total flare on a long-range scale.

In step 817, the particular value of the long-range contribution for the flare effect is obtained for a given point from the two dimensional array computed in step 816 or from the two dimensional array generated in step 821.

In step 809, the intermediate range is computed. The range is a square box with dimensions of 3 by 3 µm. The size of the box is determined by the speed accuracy tradeoff.

In step 810, all the mask shapes within or intersecting the square box obtained in step 809 are considered. For the mask shapes that are only partially included in the above square box, the portions that are only within the square box are taken into account.

In the next step 811, the invention checks if a wavefront is provided. If the wavefront is indeed provided, then, in step 812, the invention follows the methodology described in the prior art Patent Application "Incorporation of phase map into fast model-based optical proximity correction simulation kernels to account for near and mid-range flare", Ser. No. 10/694,465, of common assignee, to compute the kernels convolved. The convolved kernels are stored in a two-dimensional array. The discretizing of the convolution kernels is decided on the basis of the speed-accuracy tradeoff. These values account for the intermediate-range contribution for the flare effect if the wavefront is provided.

If a wavefront is not provided, in step 813, the invention convolves the shapes obtained in step 810 with the flare kernel computed in step 803. The convolution kernels are stored in a two-dimensional array. The discretization of the convolution kernels is decided on the basis of the speed-accuracy tradeoff. These values account for the intermediate-range contribution of the flare effect if the wavefront is not provided.

In step 814, the particular value of the intermediate-range contribution for the flare effect is obtained for the given point from the two-dimensional array computed either in step 812 (in case the wavefront is provided) or in step 813 (in the case where a wavefront is not provided).

The next few steps of the invention 804 through 808 correspond to the computation of the short-range effect. This method follows the method described in prior art FIG. 2.

In step 804, the kernels for the Sum of Coherent Systems (SOCS) are obtained using the method described in the Prior Art section. The convolution kernels are stored in a plurality of two dimensional arrays.

In step 805, a 1 by 1 µm box is considered around a selected point. The size of the box is determined by the speed accuracy tradeoff.

In the next step 806, all the mask shapes within or intersecting the square box obtained step 805 are considered. For the mask shapes that are only partially included in the above square box, only the portions that are within the square box are considered.

In the following step 807, the shapes computed in step 806 are convolved with the SOCS kernels obtained in step 804. The convolved images are stored in a plurality of two-dimensional arrays. These values account for the short-range contribution of the optical effect.

In the final step 822, the contributions from the short range effect (computed in step 807), intermediate range effect (computed in step 814) and the long range effect (computed in step 817) are combined to generate the intensity of image at the given point.

The present invention is ultimately implemented in a digital computer, which main components are: a central processing unit (CPU), at least one input/output (I/O) device (such as a keyboard, a mouse, a compact disk (CD) drive, and the like), a controller, a display device, a storage device capable of reading and/or writing computer readable code, and a memory—all of which are interconnected, e.g., by a bus or a communications network. The present invention can be implemented as a computer program product stored on a computer readable medium, such as a tape or compact disk. The computer program product includes instructions to implement the method according to the present invention in the digital computer. Finally, the present invention can also be implemented in a plurality of digital computers, with the components residing in close physical proximity or distributed over a large geographic region and connected by a communications network.

While the present invention has been particularly described, in conjunction with a specific preferred embodiment, it is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A method of computing an image intensity of an evaluation point for a mask shape of a mask layout comprising steps of:
 a. sub-dividing said mask layout into a plurality of regions, wherein the outermost boundaries of said plurality of regions are at a predetermined distance from said evaluation point;
 b. considering at least one mask shape on said mask layout in at least one region of said plurality of regions;
 c. computing a contribution of said at least one mask shape in said at least one region to the image intensity at said evaluation point;
 d. combining contributions from all mask shapes in said at least one region to the image intensity at said evaluation point; and
 e. combining contributions from all said pluraty of regions to the image intensity at said evaluation point.

2. The method as recited in claim 1, wherein said step b further comprises steps of:
 a. providing a target design, said target design having a target image shape divided into segments, each of said segments having an associated segment evaluation point;
 b. providing an initial mask shape, and dividing said initial mask shape into mask segments corresponding to each of said segments;
 c. determining a simulated image corresponding to each of associated segment evaluation point, wherein said simulated image is formed in accordance with said initial mask shape for a lithographic process;
 d. providing a deviation tolerance for a deviation of a simulated image metric from a corresponding target image metric, and determining for each associated segment evaluation points a simulated image metric based on said simulated image at said associated segment evaluation point; and
 e. refining the mask segment corresponding to said associated segment evaluation point if said simulated image metric exceeds said deviation tolerance.

3. The method as recited in claim 2, wherein said simulated image at said evaluation point further comprises optical effects due to mask shapes present in said mask layout.

4. The method as recited in claim 3, wherein computation of said simulated image at said evaluation point further comprises steps of:
 a. providing at least a short range interaction region for said evaluation point;
 b. computing a plurality of mask shapes within a short range interaction region;
 c. determining a component of a short range image intensity from at least one of said plurality of mask shapes within said short range interaction region;
 d. providing at least one intermediate range interaction region for said evaluation point;
 e. computing a plurality of mask shapes within an intermediate range interaction region;
 f. computing a component of intermediate range image intensity from at least one of said plurality of mask shapes within said intermediate range interaction region;
 g. providing at least one long range interaction region for said evaluation point;
 h. computing a plurality of mask shapes within a long range interaction region;
 i. computing a component of a long range image intensity from at least one of plurality of mask shapes within said long range interaction region, and
 j. combining a plurality of said components of said short range image intensity, a plurality of components of said intermediate range image intensity, and a plurality of components of said long range image intensity.

5. The method as recited in claim 4, wherein said computing a component of an intermediate range image intensity further comprises steps of:
 a. computing at least one flare kernel and storing the computed values in at least one array;
 b. convolving at least one of said plurality of mask shapes within said intermediate range interaction region with said at least one flare kernel; and
 c. obtaining a component of the intermediate range image intensity from said at least one array by interpolating the computed values corresponding to said evaluation point.

6. The method as recited in claim 4, wherein said computing a component of a long range image intensity comprises steps of:
 a. computing at least one flare kernel and storing the computed values in at least one array;
 b. obtaining a density map for said mask layout;
 c. convolving said density map with at least one said flare kernel;
 d. storing a result of said convolving in at least one array; and
 e. obtaining a component of the long range image intensity from the at least one array by interpolating values corresponding to said evaluation point.

7. The method as recited in claim 4, wherein said computing a component of a long range image intensity component comprises steps of:
 a. computing a value of at least one power-law flare kernel and storing said computed value in at least one array;
 b. computing a value of at least one stray-reflection flare kernel and storing said computed value in at least one array;
 c. obtaining at least one density map for said mask layout in a fine-scale;
 d. convolving said fine-scale density map with at least one of said power-law flare kernels;
 e. storing a value of said convolving in at least one array tabulating long-range power-law flare;
 f. obtaining at least a density map for said mask layout in a coarse scale;
 g. convolving said coarse-scale density map with at least one of said stray-reflection flare kernels;
 h. storing a value of said convolving in at least one array tabulating long-range stray-reflection flare;
 i. storing a sum of said power-law flare kernel and said stray-reflection flare kernel in at least one long-range array; and
 j. determining a component of said long-range image intensity from at least one long-range array by interpolating the values corresponding to said evaluation point.

8. A method of simulating a wafer image intensity for a mask layout comprising steps of:
 a. providing at least one mask shape and at least one target shape corresponding to said mask shape;
 b. dividing said target shape into a plurality of target segments;
 c. dividing said mask shape into mask segments corresponding to each of said target segments;

d. providing each of said plurality target segments with an associated segment evaluation point;
e. providing at least one short range interaction region for said evaluation point and computing a plurality of mask shapes within said short range interaction region;
f. providing at least an intermediate interaction region for said evaluation point, and computing a plurality of mask shapes within said intermediate range interaction region;
g. computing a component of an intermediate range image intensity from at least one of said plurality of mask shapes;
h. providing at least one long range interaction region for said evaluation point, and computing a plurality of mask shapes within said long range interaction region;
i. computing a component of a long range image intensity from at least one of said plurality mask shapes;
j. combining the plurality of said components of said short range image intensity, a plurality of components of said intermediate range image intensity, and a plurality of components of said long range image intensity to compute a simulated image intensity at said evaluation point; and
k. interpolating said simulated image intensity at a plurality of said associated segments evaluation points to form a simulated image for said mask shape.

9. The method of claim 8, wherein said simulated image intensity at said associated seament evaluation point comprises optical effects due to mask shapes present in said mask layout.

10. The method as recited in claim 8, wherein said computing a component of an intermediate range image intensity computation comprises steps of:
a. computing values of at least one flare kernel and storing said values in at least one array;
b. convolving at least one of said plurality of mask shapes within said intermediate range interaction region with said flare kernel; and
c. obtaining a component of said intermediate range image intensity from said at least one array by interpolating the values corresponding to said evaluation point.

11. The method as recited in claim 8, wherein said computing a component of a long range image intensity comprises steps of:
a. computing values of at least one flare kernel and storing said values in at least one array;
b. obtaining at least one density map for said mask layout;
c. convolving said density map with at least one of said flare kernels;
d. storing the values of said convolving in at least one array; and
e. obtaining a component of said long range image intensity from said at least one array by interpolating said values corresponding to said evaluation point.

12. A program storage device readable by a machine, tangibly embodying a program of instructions executable by the machine to perform method steps for computing image intensity of an evaluation point for a mask shape of a mask layout, said method steps comprising:
a. sub-dividing said mask layout into a plurality of regions, wherein the outermost boundaries of said plurality of regions are at a predetermined distances from said evaluation point;
b. considering at least one mask shape on said mask layout in at least one region of said plurality of regions;
c. computing a contribution of said mask shape in said at least one region to the image intensity at said evaluation point;
d. combining contributions from all mask shapes in said at least one region to the image intensity at said evaluation point; and
e. combining contributions from all said plurality of regions to the image intensity at said evaluation point.

13. The program storage device as recited in claim 12, wherein said method step b further comprises method steps of:
a. providing a target design, said target design having a target image shape divided into segments, each of said segments having an associated segment evaluation point;
b. providing a mask shape, and dividing said mask shape into mask segments corresponding to each of said segments;
c. determining a simulated image corresponding to each of said associated segment evaluation points, wherein said simulated image is formed in accordance with said mask shape for a lithographic process;
d. providing a deviation tolerance for a deviation of a simulated image metric from a corresponding target image metric, and determining for each of said associated segment evaluation points a simulated image metric based on said simulated image at said associated segment evaluation point; and
e. refining the mask segment corresponding to said associated segment evaluation point if said simulated image metric exceeds said deviation tolerance.

14. A program storage device readable by a machine, tangibly embodying a program of instructions executable by the machine to perform method steps for performing model-based optical proximity correction, said method steps comprising:
a. providing at least one short range interaction region for an evaluation point;
b. computing a plurality of mask shapes within said short range interaction region;
c. computing a component of a short range image intensity from at least one of said plurality of mask shapes;
d. providing at least one intermediate range interaction region for said evaluation point;
e. computing a plurality of mask shapes within said intermediate range interaction region;
f. computing a component of an intermediate range image intensity from at least one of said plurality of mask shapes;
g. providing at least one long range interaction region for said evaluation point;
h. computing a plurality of mask shapes within said short range interaction region;
i. computing a component of a long range image intensity from at least one of said plurality of mask shapes; and
j. combining a plurality of components of said short range image intensity, a plurality of components of said intermediate range image intensity, and a plurality of components of said long range image intensity.

* * * * *